United States Patent
Waller et al.

(10) Patent No.: US 6,687,015 B1
(45) Date of Patent: Feb. 3, 2004

(54) METHOD AND DEVICE FOR MEASURING THE THICKNESS OF A LAYER

(75) Inventors: Reinhold Waller, Igensdorf (DE); Ralf Schnupp, Herzogenaurach (DE)

(73) Assignee: Fraunhofer Gesellschaft zur Forderung der angewandten Forschung e.V., Munich (DE)

( * ) Notice: Subject to any disclaimer, the term of this patent is extended or adjusted under 35 U.S.C. 154(b) by 0 days.

(21) Appl. No.: 10/018,555

(22) PCT Filed: Jun. 2, 2000

(86) PCT No.: PCT/DE00/01840

§ 371 (c)(1),
(2), (4) Date: Jan. 28, 2002

(87) PCT Pub. No.: WO01/01069

PCT Pub. Date: Jan. 4, 2001

(30) Foreign Application Priority Data

Jun. 28, 1999 (DE) .......................... 199 29 493
Jul. 16, 1999 (DE) .......................... 199 33 316

(51) Int. Cl.$^7$ ............................... G01B 11/06
(52) U.S. Cl. ...................... 356/630; 356/503
(58) Field of Search ................ 356/630, 631, 356/632, 73.1, 635, 636, 496, 503; 250/559.24, 550

(56) References Cited

U.S. PATENT DOCUMENTS

| | | | |
|---|---|---|---|
| 3,709,610 A | * | 1/1973 | Kruegle .................. 356/635 |
| 3,720,471 A | * | 3/1973 | Kasahara et al. ........... 356/504 |
| 3,806,251 A | * | 4/1974 | Dandliker et al. .......... 356/496 |
| 3,843,261 A | * | 10/1974 | Pryor ....................... 356/505 |
| 3,851,180 A | * | 11/1974 | Kato et al. ................. 250/550 |
| 3,884,581 A | * | 5/1975 | Pryor ....................... 356/505 |
| 4,176,961 A | * | 12/1979 | Frazee et al. .............. 356/496 |

FOREIGN PATENT DOCUMENTS

| | | |
|---|---|---|
| DE | 691 14 595 T2 | 5/1996 |
| DE | 691 17 103 T2 | 6/1996 |
| EP | 0 924 493 A1 | 6/1999 |

\* cited by examiner

*Primary Examiner*—Hoa Q. Pham
(74) *Attorney, Agent, or Firm*—Breiner & Breiner, L.L.C.

(57) ABSTRACT

The present invention is to a method for measuring the thickness of a layer on an object during a layer-depositing process, and a device by which the method can be realized. In the method, a diffraction object having at least two opposing diffracting limits at a known spacing, is positioned in such a way that a layer is deposited or absorbed at the diffracting limits of the diffraction object, whose thickness of layer has a known relationship with the thickness of the layer on the object. The diffracting limits of the diffraction object are projected by a coherent light pencil on a detection surface. The local intensity distribution, which is induced by diffraction on the detection surface, is detected and computed from the intensity distribution of the thickness of the layer. The method permits the detection of the thickness of thin layers during the layer-depositing process independently of the parameters of the material and with a high precision.

16 Claims, 1 Drawing Sheet

METHOD AND DEVICE FOR MEASURING THE THICKNESS OF A LAYER

FIELD OF INVENTION

The present invention relates to a method of measuring the thickness of a layer during a layer deposition process, as well as to a device suitable to carry out the method.

The fields of application of the present invention are in all sectors where the continuous or periodic measurement of the thickness of layer during a layer deposition or adsorption process is required or desirable. A preferred field of application is the sector of semiconductor production. Specifically in semiconductor manufacturing processes is precise monitoring and determination of the applied layers is highly important. Such a measurement of the thickness of the layer may then be employed in the automation of processes.

BACKGROUND OF THE INVENTION

In prior art, a great number of measuring methods have become known for measuring layer thicknesses, which serve to determine the thickness of adsorbed, deposited or accumulated layers.

One part of the method is based on a micro weighing operation that is carried out by application of quartz vibrators or SAW (Surface Acoustic Wave) sensors. With both sensor types, the dependence of the resonance frequency on the thickness of the material layer deposited on the sensor is evaluated. Quartz vibrators are preferably used in this process, e.g. in sputtering systems, for determining the deposited mass. SAW sensors are employed, for example, as gas sensors. The sensitive area of the sensor is provided with a gas sorption layer. The variation of the mass of the layer by a sorbed gas mass results in a variation of the resonance frequency that is detected by the method.

Such micro weighing methods involve, however, the disadvantage that the behaviour of the sensors depends also on the modulus of elasticity of the deposited additional mass. Many sensors moreover display a strong non-linear dependence on the temperature.

Apart from this micro weighing method, also acoustic methods and methods of dielectrometric measurement of the thickness of layers are known. In the acoustic methods, a sound or ultrasonic wave, respectively, is applied to the layer to be measured and then its propagation or delay time through the layer is measured. The resolution of measuring instruments presently available in the market on the basis of acoustic measuring methods is within the millimeter to micrometer range.

In the dielectrometric method the fact is utilised that the capacitance of a capacitor depends on the dielectric constant of a material disposed in the electric field of the capacitor. There, the layer to be measured is carried between the electrodes of a capacitor, and then the thickness of the layer is derived from the variation of the capacitance of this capacitor. As a matter of fact, this method is, however, only suitable when the value of the dielectric constant of the layer material is substantially different from 1. When this is not the case, the dielectrometric method cannot be employed for measuring the thickness of the layer.

Another disadvantage of dielectrometric measurement for determining the thickness of a layer consists in the aspect that the dielectric constant of the layer material must be known. Apart therefrom, the dielectrometric method can be applied only with non-metallic layers.

In many fields, optical methods are used as well for measuring the thickness of layers. These methods utilise, for example, parameters of the material of the layer, such as transmissivity, reflection, absorption, refraction or scattering. Examples of methods employed particularly in semiconductor production for determining the thickness of layers are the ellipsometry or spectroscopy.

The further known method of laser interferometry is used especially for monitoring the etching rate and the etching depth in etching processes. In these cases, however, it is necessary that the transparent layer to be etched is transparent to the laser wave length applied.

The methods so far employed specifically in the field of semiconductor production use respective specific materials parameters such as the mass, the sound velocity, etc. and are hence not suitable for measuring any materials whatsoever or for measuring stratified systems consisting of different materials. Other known methods do not achieve the required high precision for the application in semiconductor technology.

OBJECTS AND BRIEF SUMMARY OF THE INVENTION

The problem of the present invention consists in providing a method and a device for measuring the thickness of a layer during a process of depositing a layer, which is suitable for determining the thickness of the layer, particularly in semiconductor manufacturing processes, in a simple manner, independently of the employed materials and with a high precision.

The problem is solved with the method or the device according to the present invention. Expedient embodiments of the method and the device are also disclosed. The inventive device makes it possible, in particular, to open up also further fields of application as hereafter disclosed.

In the inventive method, the known physical principle of diffraction is utilised. To this end, a diffraction object is provided which has at least two opposing or parallel diffracting limits whose mutual spacing is known. This diffraction object is disposed in a process zone of the layer depositing process, where the layer to be measured is deposited or adsorbed, such that a layer is deposited or adsorbed also on the diffracting limits. The thickness of the layer depositing on the diffracting object must present a known relationship with the thickness of the layer deposited on the object to be measured. In a preferred field of application of semiconductor production, the diffraction object is therefore disposed in the process chamber envisaged for depositing the layer, preferably in the fairly close vicinity of the substrate to be coated with the layer. In the depositing process, hence the layer is deposited on both the substrate and on the diffraction object.

In another expedient application of the method, the diffraction object is preferably positioned in the vicinity of the inner wall of the process chamber. In this manner, it is possible to determine automatically the time of cleaning of the chamber, i.e. the time by which the chamber requires cleaning due to a defined thickness of the layer deposited on the chamber wall, by deriving it from the size of the thickness of the layer on the diffraction object.

The diffraction object is illuminated with a coherent light beam, i.e. a laser beam, and projected onto a detection surface. This requires that the diffracting limits of the diffraction object be positioned in the optical path of the laser beam. The distance of the diffracting limits of the diffraction object is therefore so selected that it is smaller than the diameter of the laser beam. To this end, preferably an elongate wire-shaped or rod-shaped structure is used whose diameter is selected as a function of the desired resolution and the measuring scope and is smaller than 500 μm, preferably ≦300 μm.

The local intensity distribution of the laser beam, which is present on the detection surface due to diffraction on the diffraction object, is detected by means of an appropriate detector. The respective actual thickness of the diffraction object is determined by deriving it from the intensity distribution caused by diffraction. This thickness varies in the course of the process of depositing the layer as a result of the deposited or absorbed layer. It is thus possible to compute the respective thickness of layer present at any time on the basis of the actually measured respective spacing of the diffracting limits and the known thickness of the diffracting object, i.e. the known distance of the opposing diffracting limits given at the beginning of the process.

With the inventive method, it is possible to detect the thickness of thin layers during the process of layer deposition, independently of the parameters of the material and with a high precision. The method is appropriate for a measuring scope of layer thicknesses of a few nanometers up to the millimeter range. In distinction from methods of measuring the thickness of a layer so far employed, which determine the thickness of the layer indirectly via specific parameters of the material, the present method serves to determine the thickness of the layer directly. The inventive method is hence independent of the parameters of the material of the layer to be measured, such as the mass, the dielectric constant, the conductivity or the optical characteristics.

Another advantage of the inventive method and the appertaining device resides in the aspect that the process of depositing a multiple layer, which is deposited in a corresponding manner on the diffraction object, too, can be monitored without any problems.

An essential advantage of the inventive method resides in its simple structure and the high accuracy for the measurement of the thickness of layers. This precision, which is within the nanometre range, entails particular advantages specifically when the method is applied in semiconductor production, e.g. in sputtering installations, CVD installations or etching reactors. With such applications, the laser is positioned outside the process chamber and the diffraction object is disposed inside the process chamber whilst the laser beam arrives through a window in the process chamber on the diffraction object.

The method is also appropriate for application in optically transparent liquids such as in the field of electroplating or in bio sensor systems.

Moreover, the method is suitable for determining the volume of substances sorbing on the diffraction object, via the thickness of layers.

In special fields of application of the inventive method, in which a layer is to be deposited or adsorbed on an object that is suitable as such already for use as a diffraction object in the sense of the inventive method, this object may, of course, be used directly as diffraction object. An example of such an application is the coating of wires with a varnish (e.g. copper varnish wire). In this case the wire to be coated can be positioned directly in the laser beam and serve as diffraction object.

The local intensity distribution on the detection surface can be detected, for example, by means of a CCD camera, a photo diode line, a mirror scanner or a PSD device (position sensitive device). A separate detection surface may be provided from which the intensity distribution is read, for instance by means of a CCD camera. In an alternative, the detection surface may consist of the detector directly, e.g. a line of photo diodes.

HeNe lasers or semiconductor lasers, preferably in the IR range, are employed as sources of coherent light.

In an expedient embodiment of the inventive method, a further diffraction object is provided that presents the same conditions as the diffraction object coated with the layer. This diffraction object is positioned in a partial beam coupled out from the laser beam. The arrangement is made, however, within a zone where no layer is deposited or absorbed on the diffraction object so that the distance of the diffracting limits is not influenced by the deposition of a layer. When the system is employed in the field of semiconductor production this reference diffraction object—like the laser as such—is disposed outside the process chamber. This diffraction object, too, is projected by the partial beam onto a detection surface and the resulting local intensity distribution is then detected. The distance of the diffracting limits is computed from this local intensity distribution and then compared to the known distance. In this manner, it is possible, for example, to detect a temperature increase, which could result in a variation of the distance, and to correct thus the computation of the thickness of the layer. To this end, it is necessary that both diffraction objects present the same characteristics of the material. Both diffraction objects therefore consist preferably of the same material and present the same thickness.

The two diffraction objects may be projected onto the same detection surface. With such a layout, the measurement would be carried out by mutual coverage of the two partial beams, each for the reference diffraction object and for the diffraction object to be measured, in periodic succession. When different detection surfaces are provided both measurements can be carried out in parallel and continuously.

With this embodiment, it is also possible to take possible variations of the laser beam intensity or wave length into consideration in the computation of the thickness of the layer.

The inventive device for measuring the thickness comprises a source of coherent light for emission of a light pencil as well as a detection surface onto which the light pencil is directed. A diffraction object is fixedly positioned in the light pencil between the source of light and the detection surface, which object presents at least two opposing diffracting limits in a known spacing from each other (initial spacing prior to the beginning of the measurement), which are disposed inside the light pencil. Moreover, a detector is provided for detecting a local distribution of the light intensity present on the detection surface. The detector is connected to an analyser means that computes the actual spacing of the diffracting limits of the diffraction object or the resulting thickness of a layer present or growing on the diffraction object, respectively on the basis of the measured distribution of the light intensity.

Individual components of this device have already been discussed in more details in the context of the aforedescribed method.

The inventive device can be expediently employed as a sensor. In such a case, at least the diffraction object, the detection surface and the detector are provided on a common substrate that may be carried into the appropriate measuring positions in a simple manner. The laser is preferably fixed on the substrate as well.

Moreover, the diffraction object may also be separately introduced into the environment where the effect to be measured occurs, e.g. a coating, a removal of material, or adsorption. The diffraction object is subsequently inserted into a device only for analysis, which device consists of the source of coherent light, the detection surface, the detector and the analyser means.

In an expedient embodiment, this device comprises also a further diffraction object in a partial light pencil coupled out from the light pencil emitted. In this case, the coupling and hence the spacing of the further diffraction object from the first diffraction object is designed to be variable so that the device can be adapted to the respective requirements, e.g. in a process chamber. In particular, the device must be able to permit the positioning of the reference object at a sufficient spacing from the first diffraction object so that the reference object will not be coated in application.

The inventive device can be expediently employed in other fields as well, apart from its application for measuring the thickness of layers in semiconductor production technology.

For example, the device may serve as temperature sensor used to detect and compute an expansion of the diffraction object in the laser beam, which is induced by a temperature variation. To this end, a material is used that has a defined dependence of the expansion on temperature.

In the same manner, mechanical strain of an object can be detected when the latter is used as diffraction object in the inventive device. As the mechanical strain varies the thickness of the object changes (contraction in the transverse direction as a consequence of mechanical elongation) so that this phenomenon can be detected with the inventive device with a very high accuracy.

Moreover, the inventive sensor can be used to determine the progress of a cleaning process in a process chamber. Particularly in the field of deposition of layers, it is hence possible, on the one hand, to determine the thickness of the deposited layer, and to monitor, on the other hand, a subsequent cleaning process in the process chamber, which is carried out, for example, by means of an etching gas. This cleaning process is realised to remove again the layer that was previously deposited on the diffraction object. When a thickness of layer on the diffraction object is no longer detected, this fact is a measure of the clean condition of the process chamber and then the cleaning process can be terminated. The device can be used in such a case to automate the cleaning process.

In another application, the device can be used to examine the dependence of the layer-depositing process or layer removal inn process in a process chamber on the direction. On account of this dependence on the direction in many processes, the thickness of layers varies along the periphery of the diffraction object. The variation of the thickness of the layer can be detected by subsequent rotation of the diffraction object in the coherent light beam.

The material of the diffraction object is selected in correspondence with the respective application. For example, an oxygen-sensitive layer may be provided on the diffraction object for detecting oxygen, i.e. as an $O_2$ sensor, for the detection of the variation of the thickness of the layer on the object.

The device is very rugged, has hardly a tendency to malfunction, and operates at a high speed. In particular, such a system is very inexpensive to manufacture and apply. When the device is used in the field of semiconductor production the diffraction object is replaced either after each measurement or after the deposition of several superimposed layers. In processes where the process chamber and hence also the diffraction object positioned therein are cleaned at regular intervals a replacement is not required. The same applies in the case of thermal cleaning of the diffraction object. Such thermal cleaning may be performed, for example, by application of an electric current to the diffraction object, which results in heating of the diffraction object.

BRIEF DESCRIPTION OF THE DRAWINGS

The inventive device and the inventive method will be explained in more details in the following again, by embodiments and with reference to the Figures wherein.

DETAILED DESCRIPTION OF THE INVENTION

Figure 1:
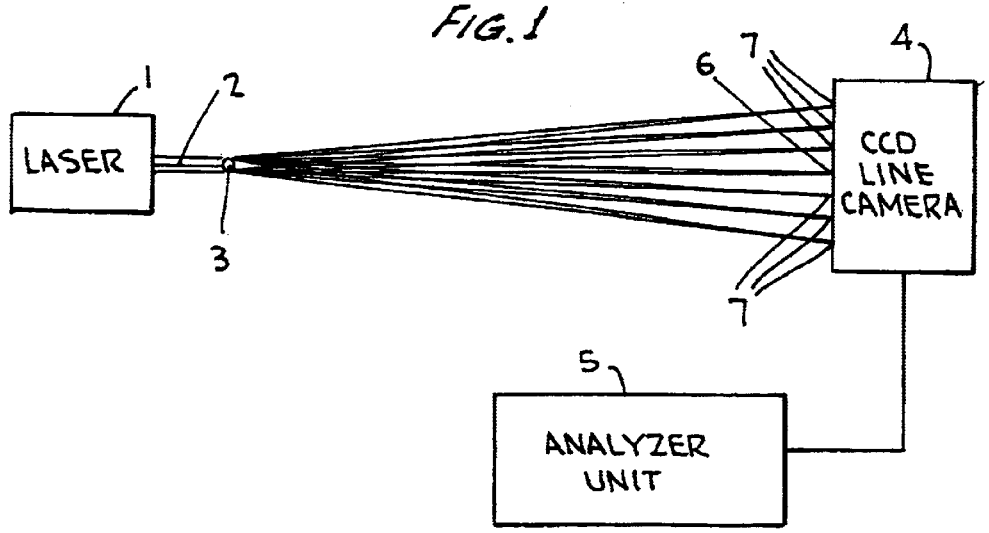
FIG. 1 shows a fundamental schematic of an embodiment of the inventive device.

FIG. 1 shows a fundamental schematic of an embodiment of the inventive device for illustration of the inventive method. The device comprises a laser 1 that emits a parallel laser beam pencil 2 of a known wave length in a direction towards a detection surface, in the present example the sensitive surface of a CCD line camera 4. A metal pin 3 is positioned as diffraction object of known thickness in the optical path of the laser beam pencil 2. The metal pin has a diameter in the range from 50 to 200 $\mu$m. The laser light is diffracted at this metal pin and generates diffraction maximums and minimums on the light-sensitive surface of the CCD line camera 4. The spacing of these diffraction maximums and minimums depends on the known thickness of the metal pin, on the known spacing of the metal pin from the detection surface—which is selected in correspondence with the desired measuring range and the desired resolution (in the present case an optical path between 20 and 30 cm)—and on the employed laser wave length. In the central zone of the detection surface, the maximum of the zero order 6 occurs in this example, which is laterally joined by the intensity maximums and minimums 7 created by diffraction. For reasons of difference in intensity, only secondary maximums or secondary minimums are preferably analysed.

For realising the measurement, the metal pin 3 is introduced into the zone where the layer is deposited. As a result of the deposition of the layer, which also results in a layer deposited or adsorbed on the surface of the metal pin, the thickness of the metal pin and hence the distribution of the maximums and minimums 7 in the diffraction pattern on the detection surface changes. The diffraction of the diffraction patterns is detected at least in one dimension, preferably in a direction orthogonal on the arrangement of the metal pin 3, by means of the line camera 4. With such a setup, it is sufficient to detect at least two secondary maximums or secondary minimums. The precision is increased as the number of maximums or minimums is increased. The positions of the individual maximums or minimums, respectively, are detected in the analyser unit 5 by application of an appropriate computer program that computes the actually present thickness of the layer from the positions of the maximums and/or the minimums, from the distance between the metal pin and the detection surface, from the initial diameter of the metal pin and from the laser wave length.

In such a system, the measurement may be continuously performed in real time. It is, of course, also possible to carry out only individual measurements at regular intervals during the process of depositing layers.

Figure 2:
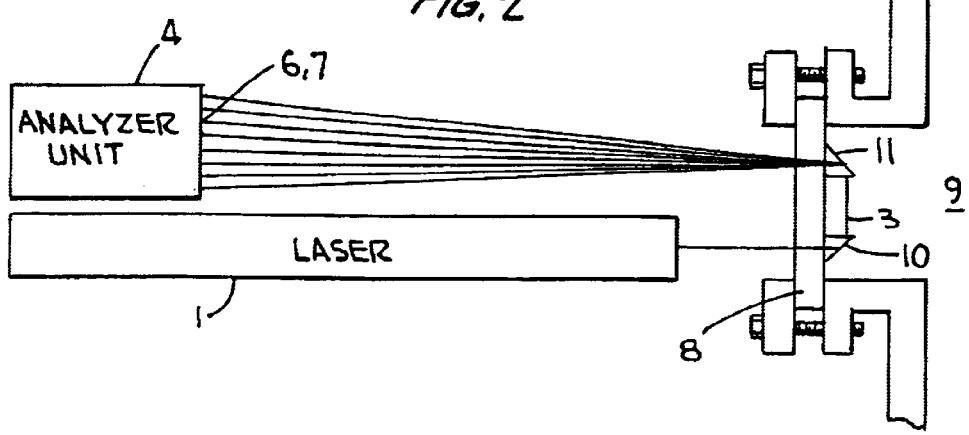
FIG. 2 illustrates an example of the arrangement of the inventive device in a process chamber.

FIG. 2 illustrates an example of the arrangement of the inventive device in a process chamber for semiconductor production. In this example, the diffraction object 3, a thin metal pin, is disposed in the vicinity of the glass window 8 of a process chamber 9.

A helium/neon laser 1 outside the process chamber emits a laser beam through the glass window 8 into the process chamber 9 where the beam is directed via a deflector element—in the present case a prism 10—onto the diffraction object 3 and subsequently via a further deflector element (prism 11) again through the glass window 8 onto an analyser unit 4 outside the process chamber 9. The local intensity distribution, i.e. the intensity maximums and minimums, of the incident beam is detected on the analyser unit 4—e.g. a CCD line—and can then be analysed. In this manner, the thickness of the layer deposited on the inner wall (not shown) of the process chamber 9—e.g. the thickness of polymer layers deposited on the wall of the process chamber—can be determined via the thickness of the layer deposited on the diffraction object 3.

What is claim is:

1. Method for measuring thickness of layers during a process in which one or several layers are deposited or adsorbed on an object, comprising:

positioning a diffraction object, which has at least two opposing diffracting limits spaced by a known distance, in a process chamber where a layer to be measured during a layer deposition process so that the layer is deposited or absorbed at said diffracting limits of said diffraction object, where thickness of layer has a known relationship with the thickness of the diffraction object;

projecting said diffracting limits of said diffraction object that is located in said process chamber, by a coherent light pencil of a known wave length onto a detection surface, with said light pencil being diffracted at said diffracting limits of said diffraction object;

detecting a local intensity distribution of said light pencil, which is caused by diffraction, on said detection surface in at least one dimension, and computing an actual distance of said diffracting limits of said diffraction object from said intensity distribution and determining the thickness of the layer from the computed actual distance.

2. Method according to claim 1, wherein the distance between the two opposing diffracting limits is $\leq 300$ $\mu$m.

3. Method according to claim 1, wherein said object on which the one or several layers is deposited or adsorbed is the diffraction object.

4. Method according to claim 1, wherein a thin wire or pin is the diffraction object.

5. Method according to claim 1, wherein a gap is the diffraction object.

6. Method according to claim 1, wherein said local intensity distribution is detected by means of a CCD camera, a photo diode cell or a scanner.

7. Method according to claim 1, further comprising a further diffraction object, which has at least two opposing diffracting limits spaced by a known distance, positioned in a partial pencil coupled out of said coherent light pencil in a zone where no layer is deposited or adsorbed on said further diffraction object, with the diffracting limits of said further diffraction object being projected by said partial pencil onto a further or the same detection surface, wherein a local intensity distribution of said partial pencil, which is present on said further or the same detection surface and is caused by diffraction, is detected in at least one dimension, and wherein the distance of said diffracting limits of said further diffraction object is computed from the intensity distribution so that in the case of a variation of the computed distance from the known distance an appropriate correction is considered in the computation.

8. Device for measuring thickness of a layer during a layer deposition process, comprising a source of coherent light for emitting a light pencil;

a detection surface onto which said light pencil is directed;

a diffraction object fixedly disposed in a process chamber between said light source and said detection surface in said light pencil, the diffraction object having at least two opposing diffracting limits spaced from each other by a known distance, and being positioned inside said light pencil;

a detector for detecting a local distribution of light intensity present on said detection surface in at least one dimension; and an analyser means that, upon variation in mutual spacing of said diffracting limits, computes an actual spacing of said diffracting limits of said diffraction object and an actual thickness of a layer inducing variation and growing on said diffraction object, from a measured distribution of the light intensity.

9. Device according to claim 8, wherein said diffracting limits of said diffraction object have an initial distance of $\leq 300$ $\mu$m.

10. Device according to claim 8, wherein said diffraction object is a thin wire or a pin.

11. Device according to claim 8, wherein said detector is a CCD camera, a photo diode line or a scanner.

12. Device according to claim 8, further comprising a further diffraction object, which has at least two opposing diffracting limits, disposed as a reference object in a partial pencil coupled out from said light pencil emitted from said source of coherent light so that an intensity distribution obtained by diffraction on said reference object can be detected and analysed.

13. The device according to claim 8, wherein the device is a temperature sensor, with said diffraction object being made of a material having a predetermined dependence on temperature.

14. The device according to claim 8, wherein the device measures mechanical strain in the diffraction object, which induces a variation of the distance between said diffracting limits of said diffraction object.

15. The device according to claim 8 in combination with a process chamber in a cleaning or etching process, wherein thickness of the layer present on said diffraction object is used as a measure of progress of said cleaning or etching process.

16. The device according to claim 8, wherein the device evaluates dependence of layer deposition or layer removal in terms of direction on processes in a process chamber.

* * * * *